(12) United States Patent
Kikuchi et al.

(10) Patent No.: US 9,407,230 B2
(45) Date of Patent: Aug. 2, 2016

(54) SOUND OUTPUT SETTING APPARATUS, METHOD, AND COMPUTER PROGRAM PRODUCT

(75) Inventors: Shinichi Kikuchi, Yokohama (JP); Hironari Nishino, Hachiouji (JP); Yasushi Tsukamoto, Yamato (JP)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 1022 days.

(21) Appl. No.: 13/346,988

(22) Filed: Jan. 10, 2012

(65) Prior Publication Data

US 2012/0185245 A1 Jul. 19, 2012

(30) Foreign Application Priority Data

Jan. 14, 2011 (JP) ................................. 2011-006247

(51) Int. Cl.
  *H03G 5/00* (2006.01)
  *H03G 3/30* (2006.01)
  *H03G 5/16* (2006.01)

(52) U.S. Cl.
  CPC ............. *H03G 5/005* (2013.01); *H03G 3/3005* (2013.01); *H03G 5/165* (2013.01)

(58) Field of Classification Search
  CPC ... H04M 1/2535; H04M 9/082; H04M 3/002; H04M 1/6066; H04L 65/1059
  USPC ............ 704/225, 233; 455/425, 566; 381/375
  See application file for complete search history.

(56) References Cited

U.S. PATENT DOCUMENTS

| | | | |
|---|---|---|---|
| 8,199,927 B1* | 6/2012 | Raftery | 381/94.1 |
| 2002/0075818 A1* | 6/2002 | Matsuo | 370/286 |
| 2004/0117804 A1* | 6/2004 | Scahill et al. | 719/320 |
| 2008/0120665 A1* | 5/2008 | Relyea et al. | 725/110 |
| 2008/0280561 A1* | 11/2008 | Lin | 455/41.2 |
| 2009/0017877 A1* | 1/2009 | Lin | 455/570 |
| 2009/0180608 A1* | 7/2009 | Kee | 379/394 |
| 2009/0299742 A1* | 12/2009 | Toman et al. | 704/233 |
| 2009/0323998 A1* | 12/2009 | Tarvonen et al. | 381/375 |
| 2010/0128888 A1* | 5/2010 | Junge et al. | 381/74 |
| 2010/0205667 A1* | 8/2010 | Anderson et al. | 726/19 |
| 2010/0322387 A1* | 12/2010 | Cutler | 379/32.01 |
| 2011/0038367 A1* | 2/2011 | Landers | H04L 12/1827 370/352 |
| 2011/0085679 A1* | 4/2011 | Jakes | H03G 3/342 381/107 |
| 2011/0243123 A1* | 10/2011 | Munoz-Bustamante | H04L 65/1053 370/352 |
| 2011/0275412 A1* | 11/2011 | Khawand | 455/566 |
| 2012/0094657 A1* | 4/2012 | Gullapalli et al. | 455/425 |
| 2012/0177225 A1* | 7/2012 | Springfield | H03G 3/34 381/107 |

FOREIGN PATENT DOCUMENTS

| | | | | |
|---|---|---|---|---|
| GB | 2461058 A | * | 12/2009 | .............. H04L 29/06 |
| JP | 2001006247 | | 1/2001 | |
| JP | 2001223811 | | 8/2001 | |
| JP | 2001256041 | | 9/2001 | |
| JP | 2006157611 | | 6/2006 | |
| JP | 2008207768 | | 9/2008 | |

* cited by examiner

*Primary Examiner* — Richemond Dorvil
*Assistant Examiner* — Mark Villena
(74) *Attorney, Agent, or Firm* — Kunzler Law Group

(57) ABSTRACT

An apparatus is provided with a device storing machine readable code and a processor executing the machine readable code. The machine readable code includes sound setting code and audio processing code. The sound setting code detects use of a microphone and sets sound characteristics that are suitable for conversation in response to detecting the use of the microphone. The audio processing code processes sound on the basis of the sound characteristics set by the sound setting code.

11 Claims, 7 Drawing Sheets

| | AT THE TIME OF EXECUTION OF VOIP APPLICATION PROGRAM 33 | AT THE TIME OF EXECUTION OF APPLICATION PROGRAM 34, OTHER THAN VOIP APPLICATION PROGRAM, THAT USES A MICROPHONE |
|---|---|---|
| MICROPHONE VOLUME | OPTIMIZED | FIXED |
| SPEAKER VOLUME | OPTIMIZED | FIXED |
| SPEAKER MUTE | OFF | ON |
| MICROPHONE MUTE | OFF | ON |
| ECHO CANCELLING FUNCTION | ON | OFF |

SOUND OUTPUT SETTING APPARATUS, METHOD, AND COMPUTER PROGRAM PRODUCT

CROSS-REFERENCE TO RELATED APPLICATIONS

This application is a national patent application and claims priority to Japanese Patent Application Number 2011-006247 entitled "Information Processor, Sound Setting Method for the Processor, and Program Executed by Computer" and filed on 14 Jan. 2011 for Shinichi Kikuchi, Hironari Nishino, and Yasushi Tsukamoto, which is incorporated herein by reference.

BACKGROUND

1. Field

The present invention relates to an information processing apparatus, a sound setting method for the processing apparatus, and a computer program product.

2. Description of the Related Art

In recent personal computers, an increasing number of users use Voice Over Internet Protocol (VOIP) applications such as Skype® to transmit and/or receive sound data. VOIP is a technique of transmitting and/or receiving sound data by using a TCP/IP network such as the Internet or intranet. For example, individuals can carry on a phone or video conversation over an internet connection. This technique is sometimes applied to extension telephones using a company LAN, Internet telephones, and other devices.

In some cases, a personal computer capable of running a VOIP application is provided with an audio device. The audio device may be used for a variety of purposes including, but not limited to, playing music, recording audio data, and/or playing audio for video. Often, a user can set audio characteristics manually on an audio setting screen. For example, a user may be able to manually modify equalizer settings to adjust how sound is played by the audio device.

BRIEF SUMMARY

Based on the foregoing discussion, the applicants have recognized that it may often be troublesome for a user to manually set the audio characteristics of the equalizer each time the user switches between different uses of the audio device. The applicants have recognized a need for an apparatus, method, and computer program product that allows for automatic setting of sound characteristics. Beneficially, such an apparatus, system, and method would automatically set sound characteristics in response to detecting changes in use of an audio device.

The embodiments of the present invention have been developed in response to the present state of the art, and in particular, in response to the problems and needs in the art that have not yet been fully solved by currently available sound setting tools. Accordingly, the embodiments have been developed to provide an apparatus, method, and computer program product for setting sound characteristics that overcome many or all of the above-discussed shortcomings in the art.

The apparatus is provided with a device storing machine readable code and a processor executing the machine readable code. In one embodiment, the machine readable code includes sound setting code and audio processing code. The sound setting code detects use of a microphone and sets sound characteristics that are suitable for conversation in response to detecting the use of the microphone. The audio processing code processes sound on the basis of the sound characteristics set by the sound setting code.

Based on the foregoing discussion, the applicants have recognized that it may often be troublesome for a user to manually set the audio characteristics of the equalizer each time the user switches between different uses of the audio device. The applicants have recognized a need for an apparatus, method, and computer program product that allows for automatic setting of sound characteristics. Beneficially, such an apparatus, system, and method would automatically set sound characteristics in response to detecting changes in use of an audio device.

The embodiments of the present invention have been developed in response to the present state of the art, and in particular, in response to the problems and needs in the art that have not yet been fully solved by currently available sound setting tools. Accordingly, the embodiments have been developed to provide an apparatus, method, and computer program product for setting sound characteristics that overcome many or all of the above-discussed shortcomings in the art.

The apparatus is provided with a device storing machine readable code and a processor executing the machine readable code. In one embodiment, the machine readable code includes sound setting code and audio processing code. The sound setting code detects use of a microphone and sets sound characteristics that are suitable for conversation in response to detecting the use of the microphone. The audio processing code processes sound on the basis of the sound characteristics set by the sound setting code.

In one embodiment, the sound characteristics include equalizing characteristics that are suitable for conversation. The equalizing characteristics that are suitable for conversation may include two peaks. In one embodiment, the sound characteristics may include sound characteristics for a speaker. The sound characteristics for the speaker may include one or more of a speaker mute and a speaker volume. In one embodiment, the sound characteristics may include sound characteristics for a microphone. The sound characteristics for the microphone may include one or more of a microphone mute and a microphone volume.

In one embodiment, the sound setting code detects the use of the microphone by a VOIP application program. In one embodiment, the sound setting code may set the sound characteristics to be suitable for conversation in response to the detecting the use of the microphone by the VOIP application program.

In one embodiment, the sound setting code detects an end of the use of the microphone. In one embodiment, the sound setting code sets the sound characteristics to a previous setting in response to the detection of the end of the use of the microphone. In one embodiment, the sound setting code sets the sound characteristics to a normal setting in response to the detection of the end of the use of the microphone.

In one embodiment, the sound characteristics may include an echo cancelling function.

A method and a computer program product are also presented for setting sound characteristics. The method and computer program product in the disclosed embodiments may substantially include steps or operations necessary to carry out the functions presented above with respect to the operation of the described apparatus.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of the embodiments as set forth hereinafter.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
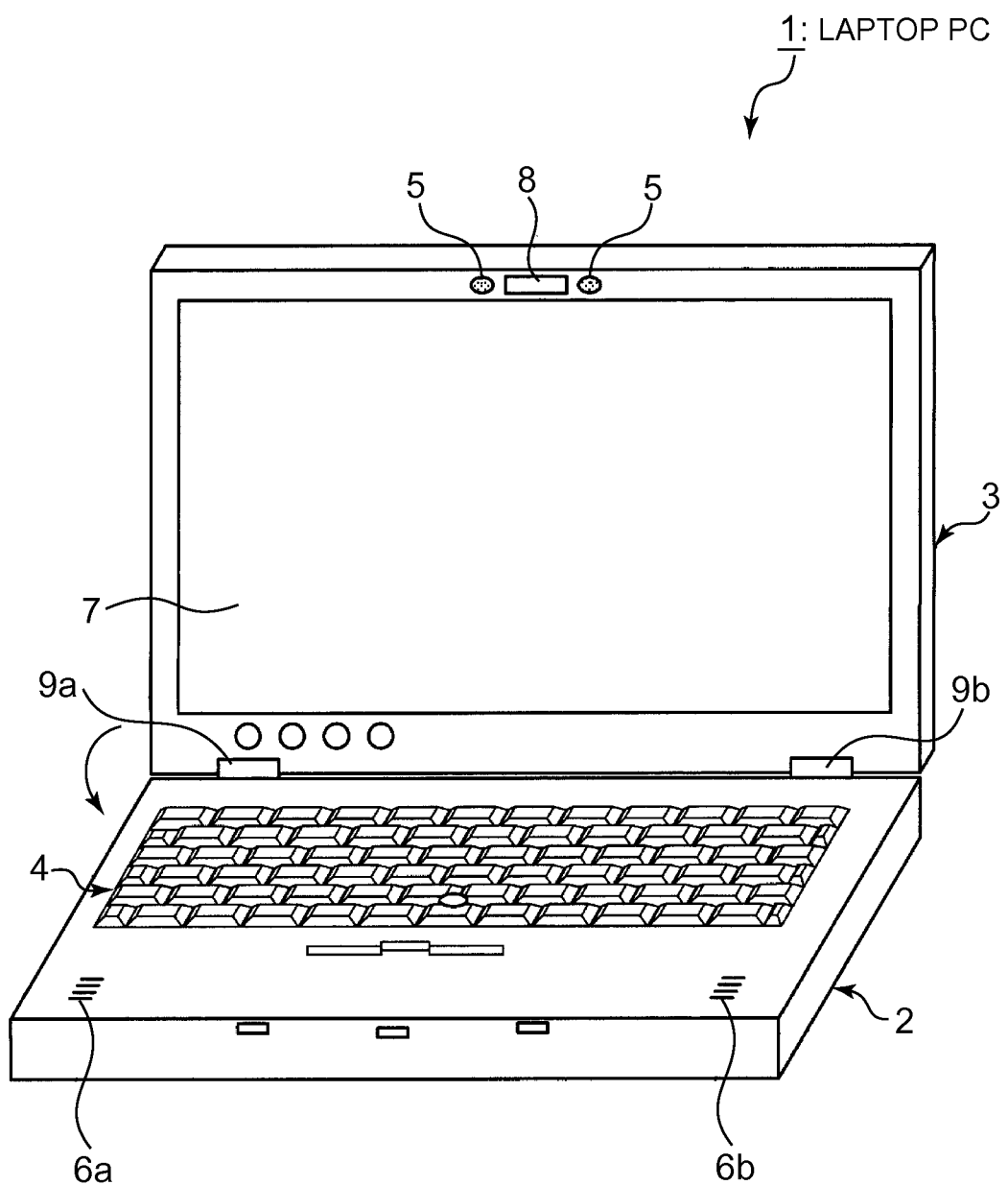
FIG. 1 is a schematic external view of one embodiment of a laptop PC to which the present disclosure may be applied.

Embodiments of a computer system to which the information processor, the sound setting method for the processor, and the program executed by a computer according to the present invention are applied will be described below. While the constituent elements of the present invention are generally illustrated in the drawings of the present specification, it will readily be understood that the same may be arranged and designed in various manners and with various configurations. Therefore, the following detailed description of the embodiments of the device, method, and program of the present invention is not to restrict the scope of the present invention defined in the claims but to merely illustrate selected embodiments of the present invention, or, selected embodiments of the device, system, and method which are consistent to the present invention defined in the claims of the present specification. Those skilled in the art will appreciate that the present invention can be implemented even if one or more of the specific items are lacking, or even with other methods, components, or materials.

FIG. 1 is a schematic external view of an exemplary laptop PC 1 to which the sound output setting apparatus, method and computer program product in accordance with the present invention is may be applied. As shown in the figure, the laptop PC 1 may include a body-side casing 2 and a display-side casing 3, both in an approximately rectangular shape. The body-side casing 2 is provided with exemplary input devices that include an input portion 4 that includes a keyboard, a touch pad and other buttons, and speakers 6a and 6b. The display-side casing 3 is provided with a liquid crystal display (LCD) 7, a camera 8, and a microphone 5. The camera 8 is arranged on the display surface side of the LCD 7, at an approximately upper center thereof, and is capable of picking up an image of a subject in front of the laptop PC 1. For example, a person sitting at the keyboard 4 of the laptop PC 1 may be visible in an image captured by the camera 8.

In the depicted embodiment, the body-side casing 2 and the display-side casing 3 are connected by a pair of left and right connecting members (hinge members) 9a and 9b, which support the casings in a freely openable and closable manner.

Figure 2:
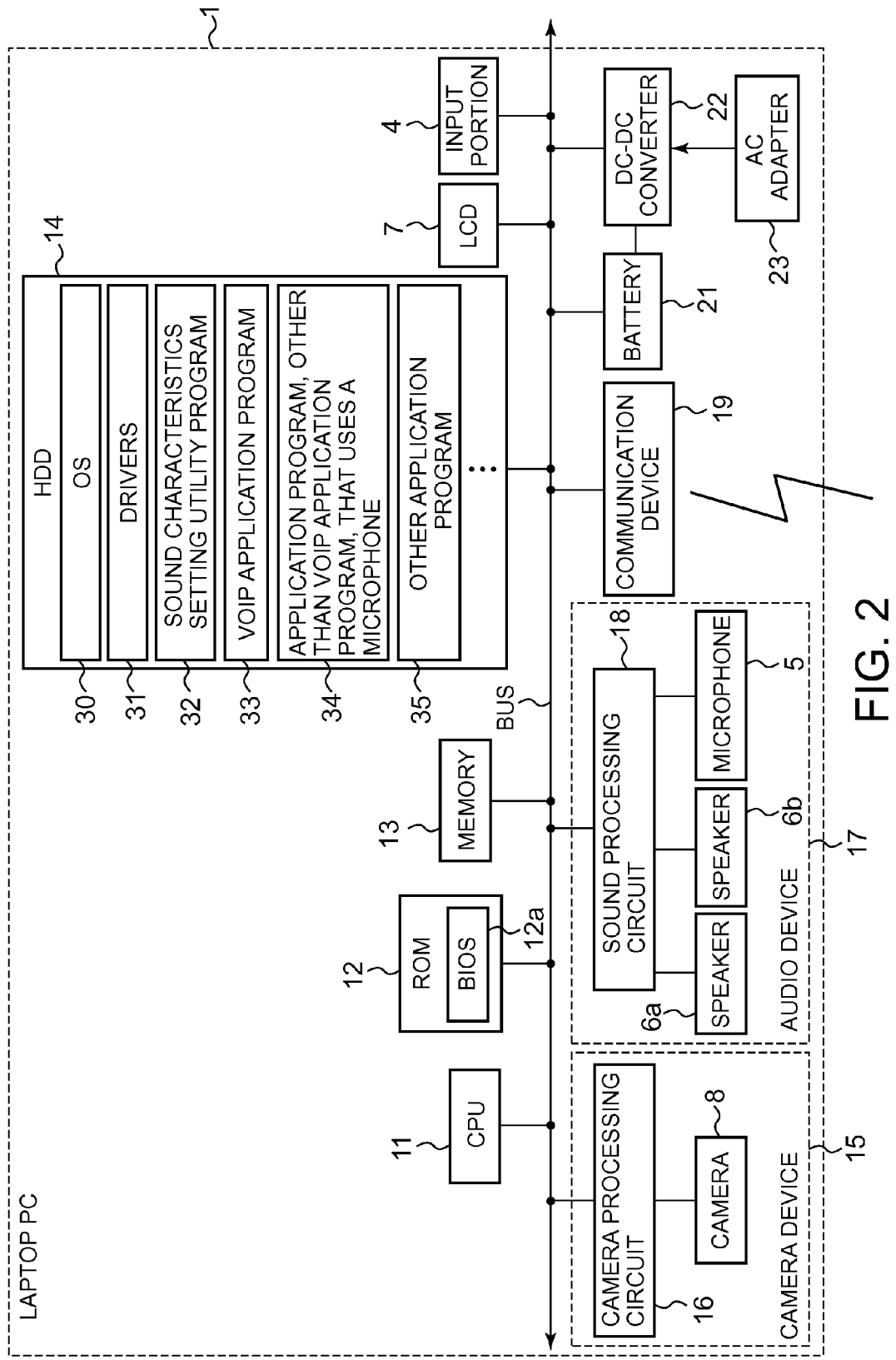
FIG. 2 is a schematic block diagram illustrating one embodiment of a hardware configuration of the laptop PC 1 in FIG. 1.

FIG. 2 schematically illustrates an exemplary hardware configuration of the laptop PC 1 in FIG. 1. As shown in the figure, the laptop PC 1 includes a CPU 11, a ROM 12, a memory 13, a hard disk drive (HDD) 14, the LCD 7, the input portion 4, a camera device 15, an audio device 17, a communication device 19, a battery 21, a DC-DC converter 22, and an AC adapter 23, which are directly or indirectly connected to one another via a BUS.

The CPU 11 performs overall control of the laptop PC 1 by means of an OS 30 stored in the HDD 14 connected via the BUS. The CPU 11 also executes processing on the basis of various programs stored in the HDD 14. The ROM 12 stores a basic input/output system (BIOS) 12a, data, and/or other information.

In one embodiment, the memory 13, is made up of a cache memory or a RAM, and may be a writable memory that is used as operating memory. For example, the memory 13 may be used as an area into which an executing program in the CPU 11 is read and/or as a work area into which processing data for the executing program is written.

The HDD 14 is a data storage device that stores data for access by the CPU 11 and/or other components of the laptop PC 1. The HDD 14 may be used to store programs, data files, and/or other data. In one embodiment, the HDD 14 stores data and/or software code. In one embodiment, the HDD 14 stores an OS 30, such as Windows® XP, Vista, 7, or the like, which may be used for overall control of the laptop PC 1. The HDD 14 may also store drivers 31 for operating hardware of peripheral devices and/or a sound characteristics setting utility program 32. In one embodiment, the HDD may store one or more portions of code including sound setting code and sound processing code. In one embodiment, these portions of code may be embodied in one or more of the applications stored on the HDD 14 and/or loaded into memory 13. The HDD 14 may also store a VOIP application program 33, an application program 34 other than the VOIP application program that uses a microphone, and another application program 35. One or more additional application programs may also be stored in some embodiments. The LCD 7, under the control of the CPU 11, converts display information into video signals to display on a display screen various information according to the converted video signals. While the LCD 7 is used as the display in the present embodiment, the present invention is not restricted thereto; another display such as an organic electroluminescent display or a CRT may be used as well.

The input portion 4 is a user interface where a user may perform input operations. The input portion 4 may include a keyboard composed of various keys for inputting characters and commands, and a touch pad for moving a cursor on the screen or for selecting menus.

The camera device 15 includes a camera 8 and a camera processing circuit 16. The camera 8 includes a lens and an image pickup portion (CCD or CMOS). The lens forms an image from the subject light, and the image pickup portion outputs the imaged subject light in the form of image signals. For example, the image signal may be output in a red, green, blue (RGB) format. The camera processing circuit 16 may include an A/D converter, an LSI for image processing, a memory, and others. In one embodiment, the camera processing circuit 16 controls the timing of driving the image pickup portion, exposure, and the like. In one embodiment, the camera processing circuit 16 may perform data processing (A/D conversion and others) on an RGB image signals obtained by the image pickup portion and/or output the resultant signal(s) to the CPU 11.

The audio device 17 includes the microphone 5, the speakers 6a and 6b, and a sound processing circuit 18. The microphone 5 collects sound and outputs the sound data to the sound processing circuit 18. The speakers 6a and 6b output sound corresponding to the sound data output from the sound processing circuit 18. The sound processing circuit 18 may include an A/D converter, a D/A converter, an LSI for sound processing, a memory, and/or other components. The sound processing circuit 18 may perform A/D conversion of the sound data input from the microphone 5, subject the resultant data to sound processing, and/or output the processed sound data (digital data) to the CPU 11. Further, the sound processing circuit 18 may perform sound processing on the (digital) sound data input from the CPU 11, and may perform D/A conversion on the processed sound data for audio output from the speakers 6a and 6b.

The communication device 19 may be used for transmitting and receiving data via a network. The communication device 19 may transmit image and sound data to the network, and receives image and sound data transmitted via the network. In one embodiment, image and/or sound data may be transmitted using a TC/IP protocol. The communication device 19 may be configured to encode image and sound data for transmission. It may also be configured to decode received encoded image and sound data.

The AC adapter 23 is connected to the commercial power supply, and converts the AC voltage into the DC voltage to be output to the DC-DC converter 22. The DC-DC converter 22 converts the DC voltage supplied from the AC adapter 23 into a predetermined voltage, for supplying power to various portions. The DC-DC converter 22 may also charge the battery 21. The battery 21 may be charged by the DC-DC converter 22 and may supply electrical power when not available through the AC adapter 23. The battery 21 may be used when the AC adapter 23 is not connected to a power supply.

Figure 3:
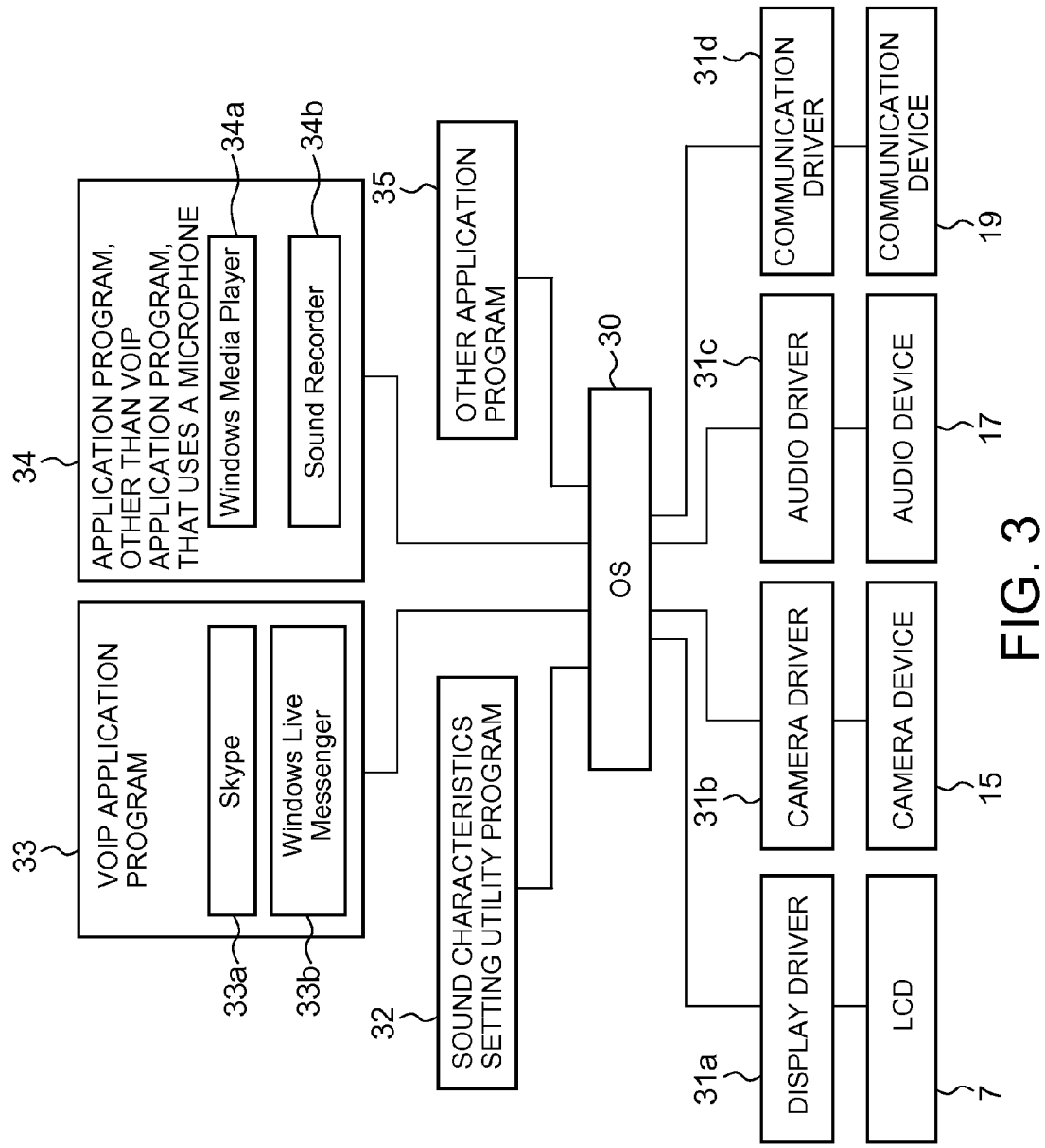
FIG. 3 is a schematic block diagram illustrating one embodiment of sound output processing in the laptop PC 1 in FIG. 2.

FIG. 3 is a schematic diagram illustrating exemplary sound output processing in the laptop PC 1 shown in FIG. 2. Referring to FIG. 3, one or more of the OS 30, the sound characteristics setting utility program 32, the VOIP application program 33 (Skype® 33a, Windows® Live Messenger 33b, etc.), the application program 34 other than the VOIP application program that uses a microphone (such as Windows® Media Player 34a, Sound Recorder 34b, etc.), the other application program 35, a display driver 31a, a camera driver 31b, an audio driver 31c, and a communication driver 31d may be read into memory 13. In one embodiment, one or more of the applications read into memory 13 may have been stored and/or installed in the HDD 14 and may be read into the memory 13 for execution by the CPU 11. In one embodiment, data and commands are transmitted between application programs, utility program, and drivers through the intermediary of the OS 30.

In one embodiment, the OS 30 controls basic operations of the laptop PC 1, and manages various resources. For example, the OS 30 may transfer an instruction issued by an application program, to the driver 31 or the BIOS 12a. The OS 30 may have a multi-task function and a multi-window function, and may be configured to also manage software resources such as execution contexts of an application program (register set, main memory image, file handle, etc. used by the application program), components of a GUI, and others.

The display driver 31 may control the LCD 7 under the direction of the OS 30. The camera driver 31b may control the camera device 15 under the direction of the OS 30. The audio driver 31c may function as sound processing code and may control the audio device 17 under the direction of the OS 30. The communication driver 31d may control the communication device 19 under the direction of the OS 30.

The VOIP application program 33 may be an application program running on the OS 30. The VOIP application may enable a telephone conversation with another device over a communication network. The conversation may include the communication of sound and/or images between two or more devices. The VOIP application program 33 may, via the OS 30, cause the communication device 19 to establish a link with another device so that images picked up by the camera 8 and sound collected by the microphone 5 are transmitted to the other terminal and images and sound transmitted from the other terminal are displayed on the LCD 7 and output from the speakers 6a and 6b.

In one embodiment, the VOIP application program 33 may use the microphone 5 for enabling a bidirectional verbal communication. In the case of using the microphone 5, a user may speak into the microphone 5 and a voice of an individual on another device may be output from the speakers 6a and 6b. In one embodiment, when the use of the microphone 5 is detected the sound output from the speakers 6a and 6b may automatically be set to sound characteristics suitable for human conversation. This may eliminate a need for the user to manually set the sound characteristics of the speakers 6a and 6b.

In one embodiment, the sound characteristics setting utility program 32 may function as detecting means and/or a sound setting code. The sound characteristics setting utility program 32 may store sound modes (for example a normal mode, a jazz mode, a dance mode, a rock mode, a classic mode, a VOIP mode, a user setting mode, and/or any other custom or pre-configured mode). In one embodiment, a sound mode may associate equalizing characteristics of the speakers 6a and 6b that is suitable for a corresponding sound modes. The user setting mode may allow a user to set the equalizing characteristics. In one embodiment, the sound characteristics setting utility program 32 selects a sound mode automatically, or selects the sound mode selected by a user on a sound mode setting screen, and sets, in the audio driver 31c, the equalizing characteristics of the speakers 6a and 6b corresponding to the selected sound mode.

Figure 4A:
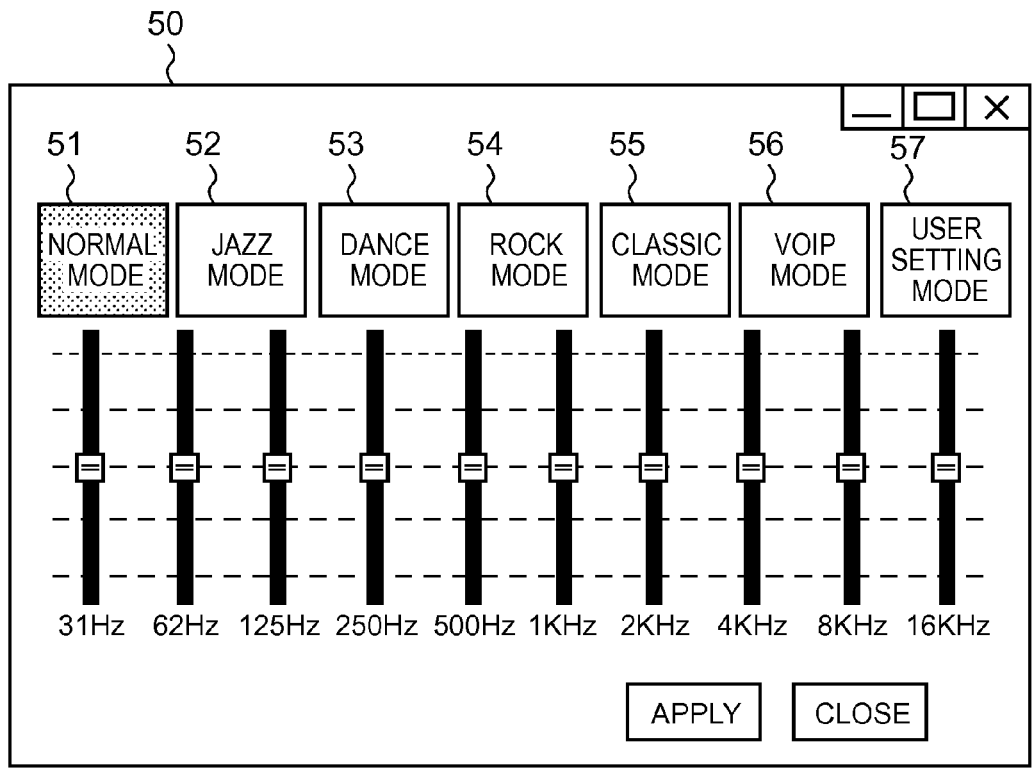
FIGS. 4A and 4B illustrate one embodiment of a sound mode setting screen.
Figure 4B:
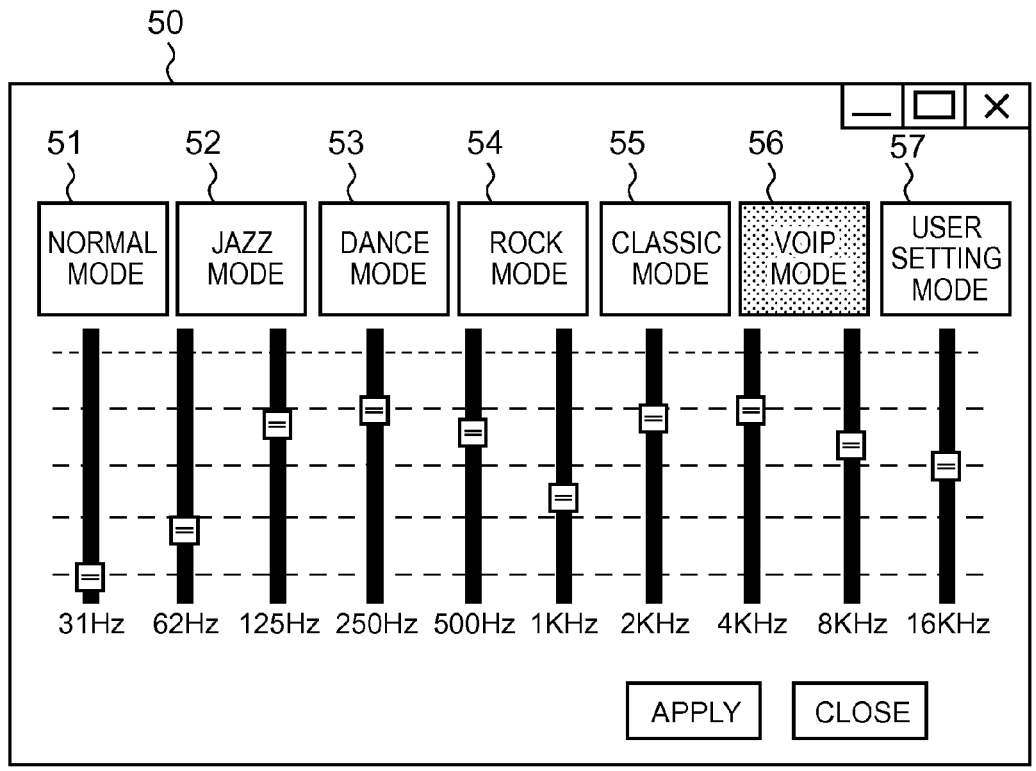

FIGS. 4A and 4B each show embodiments of a sound mode setting screen 50. The sound mode setting screens 50 shown in FIGS. 4A and 4B may be displayed in response to a user operation by the sound characteristics setting utility program 32. The user may be able to set the sound mode by selecting a button (for example, normal mode 51, jazz mode 52, dance mode 53, rock mode 54, classic mode 55, VOIP mode 56, or user setting mode 57) on the sound mode setting screen 50. In the case of the user setting mode 57, the user may be able to set the equalizing characteristics by operating the indicators of the equalizing characteristics of the speakers 6a and 6b. For example, a user may be able to use an input device to move a slider for a specific frequency band.

FIG. 4A shows an example of the equalizing characteristics of the speakers 6a and 6b in an exemplary normal mode in which the characteristics are flat across the entire frequency band. FIG. 4B shows an example of the equalizing characteristics of the speakers 6a and 6b in the VOIP mode 56. In the depicted embodiment, the equalizing characteristics are optimized for the human voice band and include two peaks, as illustrated.

Figure 5:
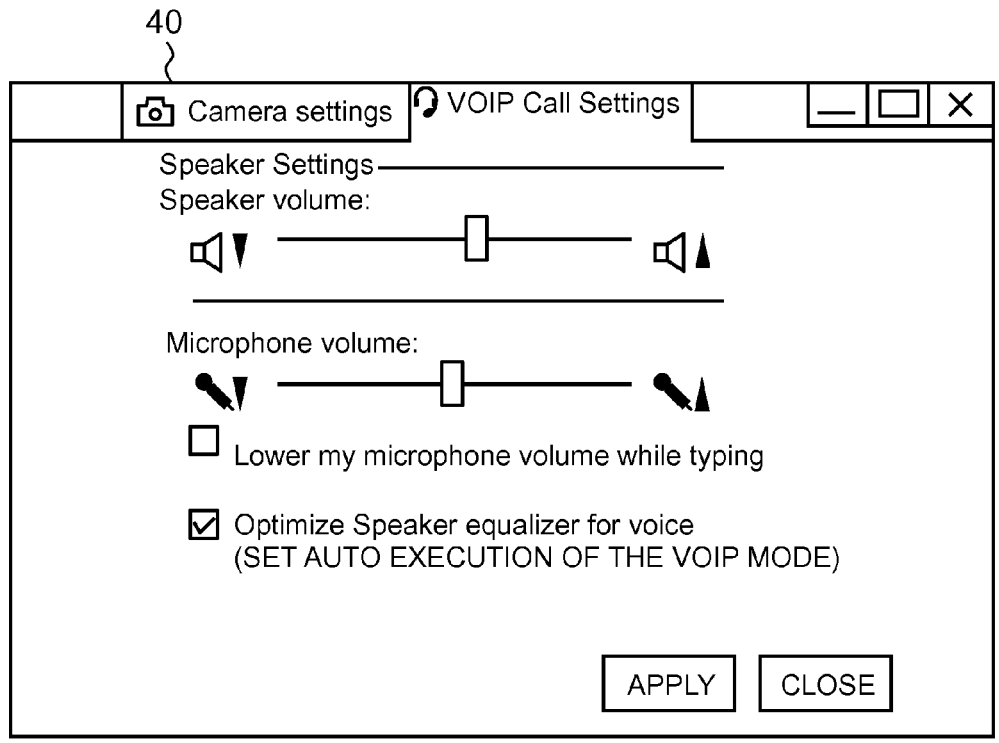
FIG. 5 illustrate one embodiment of a VOIP mode automatic setting screen.

FIG. 5 shows an example of a VOIP mode automatic setting screen 40. The VOIP mode automatic setting screen 40 shown in FIG. 5 may be displayed in response to a user operation and may be displayed by the sound characteristics setting utility program 32. In the depicted VOIP mode automatic setting screen 40, a user can set the speaker volume and the microphone volume, as well as enable an auto execution of the VOIP mode. In one embodiment, when the auto execution of the VOIP mode has been set (for example be selecting "Optimize Speaker equalizer for voice") the sound characteristics setting utility program 32 automatically sets the VOIP mode whenever use of the microphone 5 is detected. In one embodiment, when the VOIP mode has been set, the equalizing characteristics of the speakers 6a and 6b in the audio driver 31c are adjusted to correspond to those shown in FIG. 4B, which may be optimized for human voice conversations. In one embodiment, the audio driver 31c subjects sound to sound processing according to the set equalizing characteristics, whereby the processed sound is output from the speakers 6a and 6b. For example, the audio driver 31c may subject sound received by the communication device 19, and/or sound received in conjunction with the execution of a VOIP program to sound processing based on the set equalizing characteristics.

In one embodiment, if the VOIP application program 33 is started, use of the camera device 15, the audio device 17, and/or the communication device 19 may be started. In one embodiment, the sound characteristics setting utility program 32 may detect the use of the microphone 5. In one embodiment, in response to detecting use of the microphone and in the case where the auto execution of the VOIP mode has been set, the sound characteristics setting utility program 32 may set the equalizing characteristics in the audio driver 31c to the VOIP mode.

In one embodiment, images picked up by the camera 8 in the camera device 15 are transmitted from the communication device 19 to another device over a network. For example, the images may be transmitted via the camera driver 31b, the OS 30, and the communication driver 31d. In one embodiment, sound collected by the microphone 5 in the audio device 17 is transmitted from the communication device 19 to other device. For example, the sound may be transmitted via the audio driver 31c, the OS 30, and the communication driver 31d. On the other hand, images transmitted from the other terminal may be displayed on the LCD via the communication device 19, the communication driver 31d, the OS 30, and the display driver 31a. In one embodiment, sound transmitted from the other device, via the communication device 19, the communication driver 31d, and the OS 30, is input to the audio driver 31c. The audio driver 31c may process the sound according to the set equalizing characteristics of the speakers 6a and 6b and the sound may be output from the speakers 6a and 6b.

Figure 6:
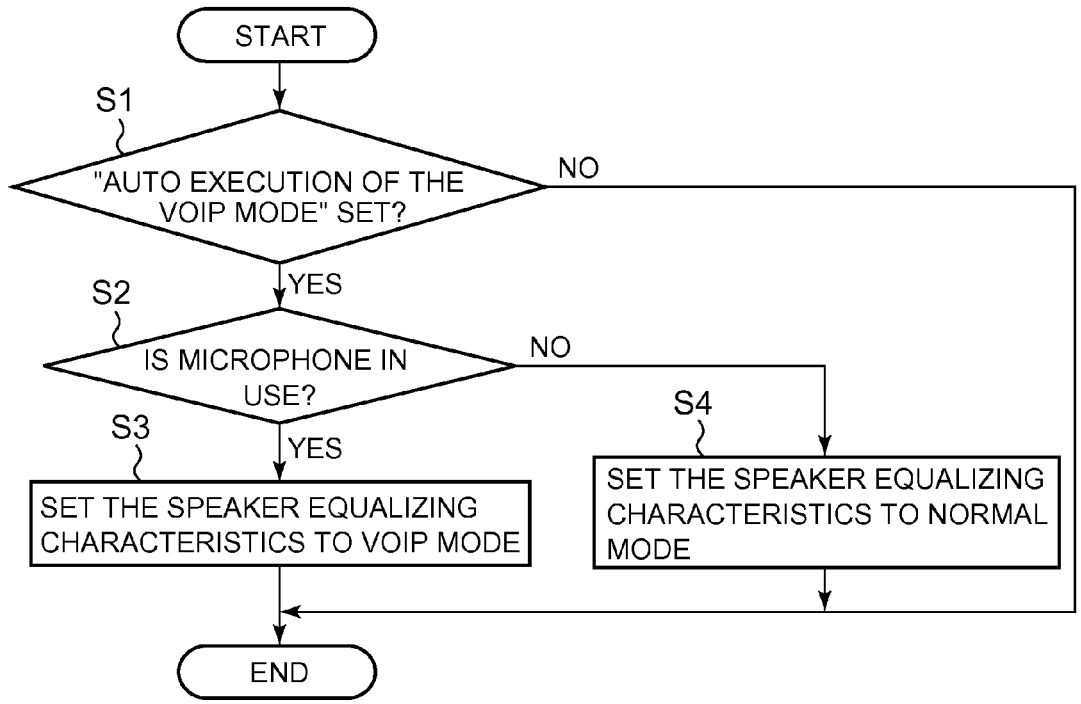
FIG. 6 is a schematic flowchart diagram illustrating a first embodiment of a method for setting sound characteristics by sound setting code.

FIG. 6 is a flowchart illustrating a first embodiment of a method for setting sound characteristics. In one embodiment, the method may be performed by the sound characteristics setting utility program 32 described above in conjunction with FIG. 3. In one embodiment, the illustrated flow of steps of the method may be repeated at predetermined intervals by the sound characteristics setting utility program 32.

Referring to FIG. 6, the sound characteristics setting utility program 32 may determine whether the auto execution of the VOIP mode has been set (step S1). If the auto execution of the VOIP mode has not been set ("No" in step S1), the sound characteristics setting utility program 32 terminates the flow. On the other hand, if the auto execution of the VOIP mode has been set ("Yes" in step S1), the program determines whether the microphone 5 in the audio device 17 is being used (step S2). If the use of the microphone 5 is detected ("Yes" in step S2), the sound characteristics setting utility program 32 sets the equalizing characteristics of the speakers 6a and 6b to the VOIP mode (step S3). On the other hand, if the use of the microphone 5 is not detected ("No" in step S2), the sound characteristics setting utility program 32 sets the equalizing characteristics of the speakers 6a and 6b to the normal mode (step S4).

While it is here assumed that the equalizing characteristics of the speakers 6a and 6b are set to the normal mode, it may be configured such that they are returned to the original sound mode. For example, assume that a user has selected the classic mode 55 on the sound mode setting screen 50 and has selected the auto execution of the VOIP mode on the VOIP mode automatic setting screen 40. In such a state, when the use of the microphone 5 is detected, the sound characteristics setting utility program 32 may set the equalizing characteristics to the VOIP mode, and thereafter, when the end of the use of the microphone 5 is detected, the utility program 32 may return the equalizing characteristics to the original classic mode 55.

As described above, according to a first embodiment, when the sound characteristics setting utility program 32 detects the use of the microphone 5, it sets the sound output from the speakers 6a and 6b to the equalizing characteristics suitable for conversation, and the audio driver 31c processes the sound such that the resultant sound exhibits the set equalizing characteristics. This enables the characteristics of the sound output from the speakers 6a and 6b to be automatically set in the case where the microphone 5 is used in an application, for example a VOIP application.

Further, the sound characteristics setting utility program 32 may store a plurality of sound modes including the VOIP mode and the equalizing characteristics suitable for the corresponding sound modes, in association with each other. When the use of the microphone 5 is detected, the sound characteristics setting utility program 32 may sets the VOIP mode so as to set the sound output from the speakers 6a and 6b to the equalizing characteristics suitable for conversation, and thereafter, when the end of the use of the microphone 5 is detected, the sound characteristics setting utility program 32 may return the sound mode to the normal mode or the original sound mode. This eliminates the need for the user to return the sound mode to the normal mode or the original sound mode, thereby improving the usability for the user.

Figure 7:
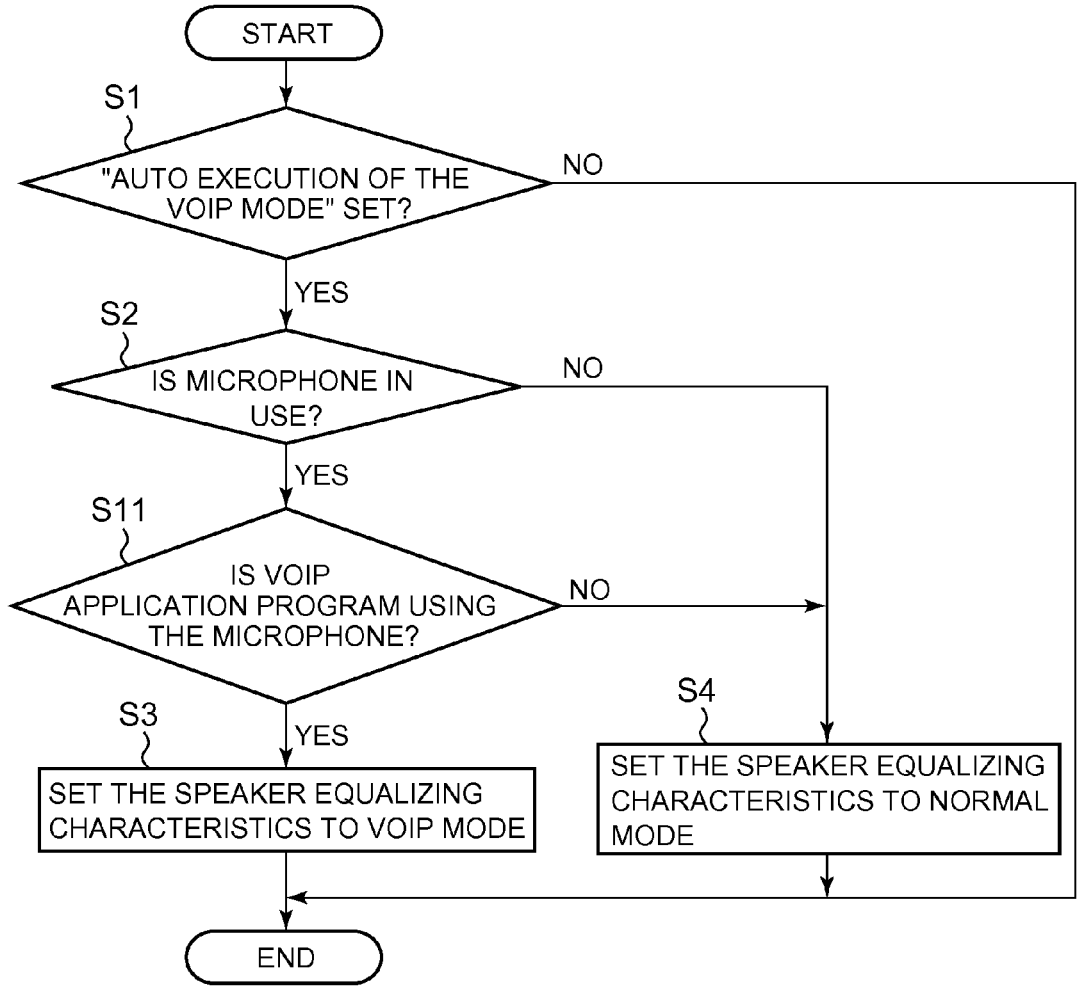
FIG. 7 is a schematic flowchart diagram illustrating a second embodiment of a method for setting sound characteristics by sound setting code.

FIG. 7 is a flowchart illustrating a second embodiment of a method for setting sound characteristics according to a second embodiment. In one embodiment, the method may be performed by a sound characteristics setting utility program 32. In FIG. 7, the steps identical in terms of processing to those in FIG. 6 are denoted by the same step numbers, and a description thereof will not be repeated. Only the differences will be described below.

Referring to FIG. 7, when the sound characteristics setting utility program 32 detects the use of the microphone 5 ("Yes" in step S2), it determines whether the application program that is currently using the microphone 5 is the VOIP application program 33 (step S11). Specifically, the sound characteristics setting utility program 32 may create in advance a list of the VOIP application programs 33 (for example, Skype® 33a, Windows® Live Messenger 33b, etc.), and determine whether the application program that is using the microphone 5 is included in the list of the VOIP application programs 33, to thereby determine whether the application program that is using the microphone 5 is the VOIP application program 33. Alternatively, the sound characteristics setting utility program 32 may create in advance a list of the application programs 34, other than the VOIP application program 33, that use the microphone (for example, Windows® Media Player 34a, Sound Recorder 34b, etc.), in which case it may determine that the application program that is using the microphone 5 is the VOIP application program 33 if the application program using the microphone 5 is not included in the list.

If it is determined that the application program currently using the microphone 5 is the VOIP application program 33 ("Yes" in step S11), the sound characteristics setting utility program 32 sets the equalizing characteristics of the speakers 6a and 6b to the VOIP mode (step S3). On the other hand, if it is determined that the application program currently using the microphone 5 is not the VOIP application program 33 ("No" in step S11), the sound characteristics setting utility program 32 sets the equalizing characteristics of the speakers 6a and 6b to the normal mode (step S4).

According to the method embodied in FIG. 7, the sound characteristics setting utility program 32 may sets the sound output from the speakers 6a and 6b to the sound characteristics suitable for conversation if the program using the microphone is a VOIP program. This may help prevent the sound output from the speakers 6a and 6b from being imparted with the sound characteristics suitable for conversation in the case where the application program using the microphone 5 is not the type that establishes a verbal communication with another party.

Figures 8, 9:
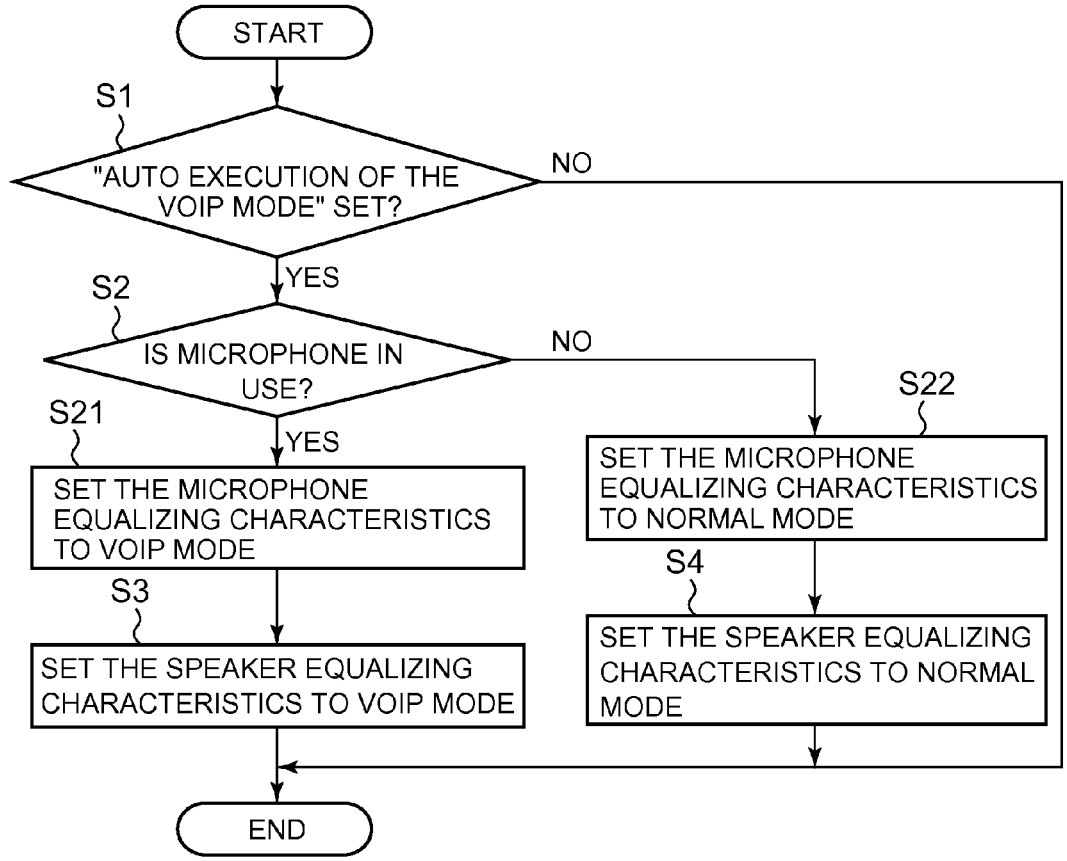
FIG. 8 is a schematic flowchart diagram illustrating a third embodiment of a method for setting sound characteristics by sound setting code.
FIG. 9 illustrates exemplary sound characteristics that may be changed when a microphone is used.

FIG. 8 is a flowchart illustrating a third embodiment of a method for setting sound characteristics. In one embodiment, the method may be performed by a sound characteristics setting utility program 32. In FIG. 8, the steps identical in terms of processing to those in FIG. 6 are denoted by the same step numbers, and a description thereof will not be repeated. Only the differences will be described below.

In one embodiment, the sound characteristics setting utility program 32 stores equalizing characteristics of the microphone 5 in the VOIP mode 56 and the normal mode 51. In the VOIP mode, the equalizing characteristics of the microphone 5 are set such that they are suitable for conversation. In the normal mode, they may be set to be flat across the entire frequency band. [0089] [0088] In one embodiment, the sound characteristics setting utility program 32 sets the equalizing characteristics of the microphone 5 in the audio driver 31c. The audio driver 31c may in turn process the sound input from the microphone 5, in accordance with the set equalizing characteristics.

Referring to FIG. 8, if the sound characteristics setting utility program 32 detects the use of the microphone 5 ("Yes" in step S2), it sets the equalizing characteristics of the microphone 5 to the VOIP mode (step S21) and also sets the equalizing characteristics of the speakers 6a and 6b to the VOIP mode (step S3). On the other hand, if the sound characteristics setting utility program 32 does not detect the use of the microphone 5 ("No" in step S2), it may set the equalizing characteristics of the microphone 5 to the normal mode (step S22) and may also sets the equalizing characteristics of the speakers 6a and 6b to the normal mode (step S4).

According to the embodiment of FIG. 8, when the use of the microphone 5 is detected, the sound characteristics setting utility program 32 may set the sound input from the microphone 5 to the equalizing characteristics suitable for conversation. This may enable the sound suitable for conversation to be output to another party who is carrying on a conversation with a user using a VOIP application program.

The embodiments of FIG. 6-8 as described above may be implemented alone or in combination. In the above embodiments, the equalizing characteristics of the speakers 6a, 6b and the microphone 5 are changed when the microphone 5 is used. The sound characteristics to be changed, however, are not restricted thereto. For example, as shown in FIG. 9, the microphone volume, the speaker volume, the speaker mute, the microphone mute, the echo cancelling function, and the like may be alternatively or additionally changed.

FIG. 9 illustrates exemplary sound characteristics that may be changed in a manner similar to that discussed in relation to the previous figures. For example, the microphone volume may be set to "volume suitable for conversation (Optimized)" in the case where the application program that is using the microphone 5 is the VOIP application program 33, and to "Fixed" in the case where an application program 34 other than a VOIP application program 33 uses a microphone. The speaker volume may be set to "volume suitable for conversation (Optimized)" in the case where the application program that is using the microphone 5 is the VOIP application program 33, and to "Fixed" in the case where an application program 34 other than a VOIP application program 33 uses a microphone.

In one embodiment, the speaker mute may be set to "Off" in the case where the application program that is using the microphone 5 is the VOIP application program 33, and to "On" in the case where an application program 34 other than the VOIP application program 33 uses a microphone. Similarly, the microphone mute may be set to "Off" in the case where the application program that is using the microphone 5 is the VOIP application program 33 and to "On" in the case where an application program 34 other than the VOIP application program 33 uses a microphone. Still further, an echo cancelling function may be set to "On" in the case where the application program that is using the microphone 5 is the VOIP application program 33 and to "Off" in the case where an application program 34 other than the VOIP application program 33 uses a microphone.

While the case of applying the present invention to the laptop PC has been described in the above embodiments, the present invention is not restricted thereto and is also applicable to other information processors including a desktop PC, a PDA, and a mobile cellular phone. Further, while the sound processing based on the set sound characteristics has been performed by software (audio driver 31c) in the above embodiments, it may be performed by hardware (audio device 17).

The information processor, the sound setting method for the processor, and the computer-executable program according to the present invention are useful in the case where a videophone function is used in an information processor that is configured to be communicable via a network and that includes an audio device having a microphone and a speaker.

DESCRIPTION OF SYMBOLS 1 laptop PC
2 body-side casing
3 display-side casing
4 input portion
5 microphone
6a, 6b speaker
7 LCD (liquid crystal display)
8 camera
9a, 9b connecting member (hinge member)
11 CPU
12 ROM
13 memory
14 HDD
15 camera device
16 camera processing circuit
17 audio device
18 sound processing circuit
19 communication device
21 battery
22 DC-DC converter
23 AC adapter
30 OS
31 driver
31c audio driver
32 sound characteristics setting utility program
33 VOIP application program
34 application program, other than VOIP application program, that uses a microphone
35 other application program Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
one or more storage devices storing machine readable code; and
one or more processors executing the machine readable code, the machine readable code comprising:
sound setting code that;
    detects use of a microphone and an application program using the microphone,
    determines a type of the application program, and
    sets sound characteristics for a speaker and the microphone in response to determining the type of the application program,
        the sound characteristics for the speaker comprising one or more of mute and volume,
        the sound characteristics for the microphone comprising one or more of mute, volume, and echo cancellation,
        wherein
            in response to determining that the application program is a VOIP application program, setting sound characteristics comprises disabling speaker mute and microphone mute, optimizing the speaker volume and microphone volume, and enabling microphone echo cancellation; and
            in response to determining that the application program is an application other than a VOIP application program, setting sound characteristics comprises enabling speaker mute and microphone mute, fixing the speaker volume and microphone volume, and disabling microphone echo cancellation; and
sound processing code that processes sound on the basis of the sound characteristics set by the sound setting code.

2. The apparatus of claim 1, wherein the sound characteristics include equalizing characteristics that are suitable for conversation.

3. The apparatus of claim 2, wherein the equalizing characteristics that are suitable for conversation comprise two peaks.

4. The apparatus of claim 1, wherein the sound setting code further detects an end of the use of the microphone and sets the sound characteristics to a previous setting in response to the detection of the end of the use of the microphone.

5. The apparatus of claim 1, wherein the sound setting code further detects an end of the use of the microphone and sets the sound characteristics to a normal setting in response to the detection of the end of the use of the microphone.

6. A method comprising:
detecting use of a microphone and an application program using the microphone;
determining a type of the application program, and
setting sound characteristics for a speaker and the microphone in response to determining the type of the application program;
    the sound characteristics for the speaker comprising one or more of mute and volume,
    the sound characteristics for the microphone comprising one or more of mute, volume, and echo cancellation,
    wherein
        in response to determining that the application program is a VOIP application program, setting sound characteristics comprises disabling speaker mute and microphone mute, optimizing the speaker volume and microphone volume, and enabling microphone echo cancellation; and
        in response to determining that the application program is an application other than a VOIP application program, setting sound characteristics comprises enabling speaker mute and microphone mute, fixing the speaker volume and microphone volume, and disabling microphone echo cancellation; and
processing sound on the basis of the sound characteristics set in the sound characteristics setting step.

7. The method of claim 6, wherein the sound characteristics include equalizing characteristics.

8. The method of claim 7, wherein the equalizing characteristics comprise two peaks.

9. The method of claim 6, wherein the method further comprises detecting an end of the use of the microphone and setting the sound characteristics to a previous setting in response to the detection of the end of the use of the microphone.

10. The method of claim 6, wherein the method further comprises detecting an end of the use of the microphone and setting the sound characteristics to a normal setting in response to the detection of the end of the use of the microphone.

11. A computer program product comprising a storage device storing machine readable code executed by a processor to perform the operations of:

detecting use of a microphone and an application program using the microphone;
determining a type of the application program, and
setting sound characteristics for a speaker and the microphone in response to determining the type of the application program;
  the sound characteristics for the speaker comprising one or more of mute and volume,
  the sound characteristics for the microphone comprising one or more of mute, volume, and echo cancellation, wherein
    in response to determining that the application program is a VOIP application program, setting sound characteristics comprises disabling speaker mute and microphone mute, optimizing the speaker volume and microphone volume, and enabling microphone echo cancellation; and
    in response to determining that the application program is an application other than a VOIP application program, setting sound characteristics comprises enabling speaker mute and microphone mute, fixing the speaker volume and microphone volume, and disabling microphone echo cancellation; and
processing sound on the basis of the sound characteristics set in the sound characteristics setting step.

* * * * *